(12) United States Patent
Robert et al.

(10) Patent No.: US 10,367,539 B2
(45) Date of Patent: Jul. 30, 2019

(54) INTEGRATED CIRCUIT INCLUDING A PLURALITY OF COMPONENTS INCLUDING A TRANSFORMER

(71) Applicant: NXP B.V., Eindhoven (NL)

(72) Inventors: Sebastien Robert, Emieville (FR); Guy Le Moal, Rots (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/046,191

(22) Filed: Jul. 26, 2018

(65) Prior Publication Data
US 2019/0109612 A1    Apr. 11, 2019

(30) Foreign Application Priority Data
Oct. 11, 2017   (EP) ..................................... 17306368

(51) Int. Cl.
| | |
|---|---|
| H04B 1/18 | (2006.01) |
| H04B 1/3888 | (2015.01) |
| H01F 27/28 | (2006.01) |
| H01F 27/40 | (2006.01) |
| H01F 27/29 | (2006.01) |

(52) U.S. Cl.
CPC ....... *H04B 1/3888* (2013.01); *H01F 27/2804* (2013.01); *H01F 27/29* (2013.01); *H01F 27/40* (2013.01); *H01F 2027/2809* (2013.01)

(58) Field of Classification Search
CPC ........ H04B 1/3888; H04B 1/40; H04B 1/401; H04B 1/44; H04B 1/581
See application file for complete search history.

(56) References Cited

U.S. PATENT DOCUMENTS

| | | |
|---|---|---|
| 8,229,367 B2 | 7/2012 | Chan et al. |
| 9,431,473 B2 | 8/2016 | Lo et al. |

(Continued)

FOREIGN PATENT DOCUMENTS

WO    2017/099578 A1    6/2017

OTHER PUBLICATIONS

Prummel, Jan, et al; "A 10mW Bluetooth Low-Energy Transceiver with On-Chip Matching;" ISSCC 2015 Session 13; Energy-Efficient RF Systems; 13.3; 2015 IEEE International Solid-State Circuits Conference.

(Continued)

*Primary Examiner* — Tuan Pham (57) ABSTRACT

An integrated circuit comprising a transceiver including a transformer. The transformer includes an input coupled to one or more primary windings. The transformer also includes a first differential output coupled to a first set of one or more secondary windings. The transformer further includes a second differential output coupled to a second, different set of one or more secondary windings. A method of making an integrated circuit comprising a transceiver. The method includes forming a plurality of components on and/or in a semiconductor substrate. At least one of the components comprises a transformer. The method includes forming the transformer by forming one or more primary windings coupled to an input, forming a first set of one or more secondary windings coupled to a first differential output, and forming a second, different set of one or more secondary windings coupled to a second differential output.

12 Claims, 5 Drawing Sheets

(56) References Cited

U.S. PATENT DOCUMENTS

| | | | |
|---|---|---|---|
| 2006/0270377 A1 | 11/2006 | Bhatti et al. | |
| 2007/0184790 A1* | 8/2007 | Gilberton | H03F 1/0205 |
| | | | 455/127.1 |
| 2009/0284339 A1 | 11/2009 | Choi et al. | |
| 2012/0025927 A1 | 2/2012 | Yan et al. | |
| 2012/0295556 A1* | 11/2012 | Chien | H03F 1/56 |
| | | | 455/78 |
| 2013/0157587 A1 | 6/2013 | Blanchet et al. | |
| 2013/0267185 A1* | 10/2013 | Chen | H04B 1/44 |
| | | | 455/78 |
| 2017/0176364 A1* | 6/2017 | Lyon | G01V 3/105 |

OTHER PUBLICATIONS

Silicon Labs; "AN923: EFR32 sub-GHz Matching Guide;" Silicon Labs Rev. 0.1/23. (Identified by Applicant prior to the filing of this application on Jul. 26, 2018). [https://www.silabs.com/search?q=an923;page=1].

Silicon Labs; "AN930: EFR32 2.4 GHz Matching Guide;" Silicon Labs Rev. 0.2/34. (Identified by Applicant prior to the filing of this application on Jul. 26, 2018). [https://www.silabs.com/search?q=an930;page=1; x6=searchHeader;q6=All].

* cited by examiner

INTEGRATED CIRCUIT INCLUDING A PLURALITY OF COMPONENTS INCLUDING A TRANSFORMER

CROSS-REFERENCE TO RELATED APPLICATIONS

This application claims priority under 35 U.S.C. § 119 to European Patent application No. 17306368.6, filed on 11 Oct. 2017, the contents of which are incorporated by reference herein.

BACKGROUND

The present specification relates to an integrated circuit comprising a transceiver, the transceiver including a transformer. The present specification also relates to a method of making an integrated circuit comprising a transceiver.

In modern integrated transceivers, the Radio Frequency (RF) signal is typically a differential signal. An external balun is often used to perform the single ended to differential conversion between an antenna and an integrated transceiver having a differential input. The use of an integrated transformer may avoid the use of an external balun, and may lead to cost reductions.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an integrated circuit comprising a transceiver, the transceiver including a transformer, the transformer comprising:

an input coupled to one or more primary windings of the transformer;

a first differential output coupled to a first set of one or more secondary windings of the transformer;

a second differential output coupled to a second, different set of one or more secondary windings of the transformer.

According to another aspect of the present disclosure, there is provided a method of making an integrated circuit comprising a transceiver, the method comprising:

providing a semiconductor substrate; and forming a plurality of components on and/or in the semiconductor substrate, wherein at least one of the components comprises a transformer, and wherein the method includes forming the transformer by:

forming one or more primary windings coupled to an input of the transformer;

forming a first set of one or more secondary windings coupled to a first differential output of the transformer; and forming a second, different set of one or more secondary windings coupled to a second differential output of the transformer.

The provision of a transceiver including a transformer integrated in an integrated circuit can reduce the cost and size of the transceiver. Moreover, since the transformer has separate outputs, each with its own set of associated windings, these outputs can be independently tailored to different applications.

For instance, in one embodiment, the first differential output may be coupled to a receive path of the transceiver while the second differential output may be coupled to a transmit path of the transceiver. The secondary windings and corresponding outputs can be separately tailored for use with their respective receive/transmit paths.

In some embodiments, the receive path may include a switch that is switchable between an ON state for coupling the receive path to the first differential output and an OFF state for decoupling the receive path from the first differential output. The switch may be operable switch to the OFF state to decouple the receive path from the first differential output when the transmit path is active. This may avoid high voltage swings coming into the receive path, which may prevent damage of potentially sensitive components of the receive path.

The switch may be included in an attenuator of the receive path. In some examples, more than one switch having the functionality set out above may be included in the attenuator. Each switch may thus be switchable between an ON state for coupling the receive path to the first differential output when the transmit path is not active and an OFF state for decoupling the receive path from the first differential output when the transmit path is active. In some examples, where more than one such switch is included in the attenuator, the switches may operate together (e.g. be operable to switch together (e.g. substantially at the same time)) to couple/decouple the receive path and the first differential output.

The integrated circuit may include a centre tap. The centre tap may be coupled to the first set of secondary winding(s). This may allow the operation of the switch to be optimised. For instance, the center tap may be operable to connect to ground when the switch is in the ON state. This may reduce the ON state resistance of the switch. The center tap may be operable to connect to a supply voltage of the integrated circuit or to a voltage intermediate the supply voltage and ground when the switch is in the OFF state. This may reduce to OFF state capacitance of the switch.

The input may be coupled to an antenna.

The first set of secondary winding(s) may have a different number of windings to the second set of secondary winding(s). In this way, the first set of secondary winding(s) may have a different winding ratio with respect to the primary winding(s) than the second set of secondary winding(s). This can allow the transformer to be tuned/optimised for particular applications (e.g. the specific configuration of the receive path and/or the transmit path).

The integrated circuit may further include a capacitor bank coupled to at least some of the windings of the transformer for tuning an operating frequency of the transformer.

The primary and secondary winding(s) of the transformer may be substantially concentric. The primary and secondary winding(s) of the transformer may be formed from electrically conductive tracks arranged on a surface of a semiconductor substrate of the integrated circuit, allowing them to be conveniently produced (e.g. as part of BEOL processing). The primary winding(s) and at least one of the sets of secondary winding(s) may be arranged in a common plane. The primary winding(s) may be arranged in-between some of the secondary winding(s) in the common plane, when viewed from above the surface of the semiconductor substrate. The windings of at least one of the sets of secondary winding(s) may be arranged in more than one plane.

These arrangements of the winding(s) of the transformer may allow the transformer conveniently and compactly to be integrated on a semiconductor die.

The input may be a differential input.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1A:
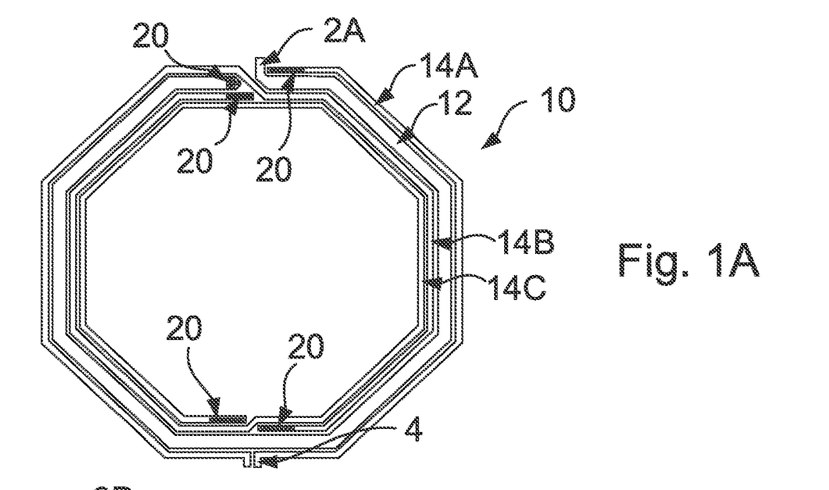
FIGS. 1A, 1B and 1C show the primary and secondary windings of a transformer in accordance with an embodiment of the present disclosure.
Figure 1B:
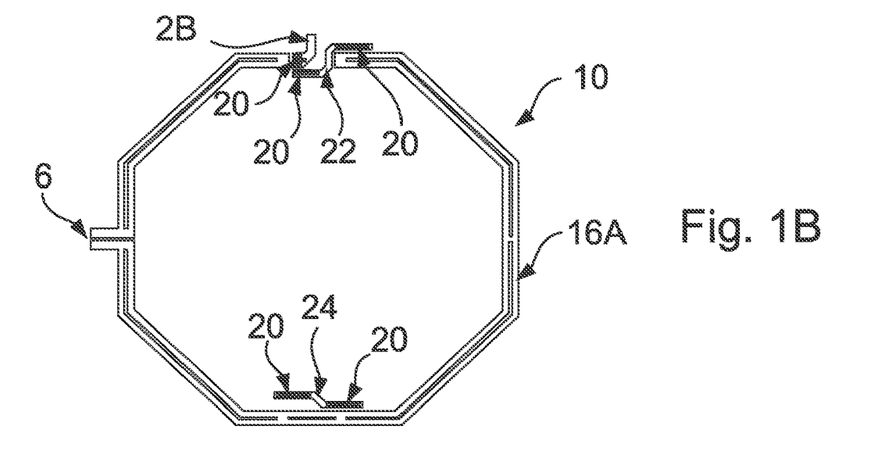
Figure 1C:
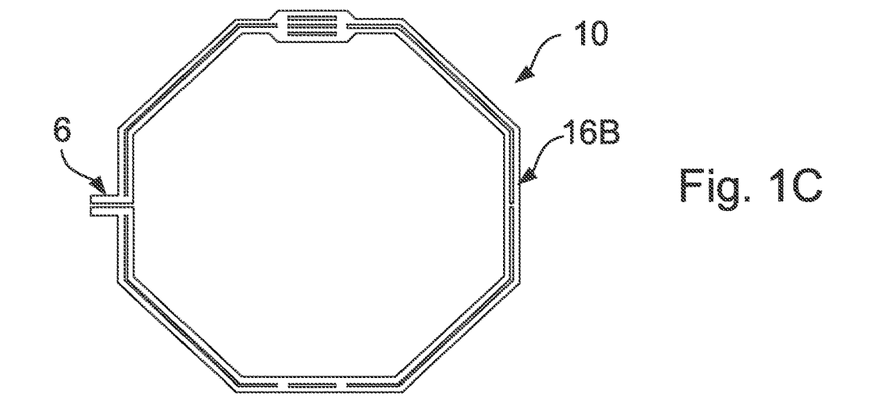
Figure 2:
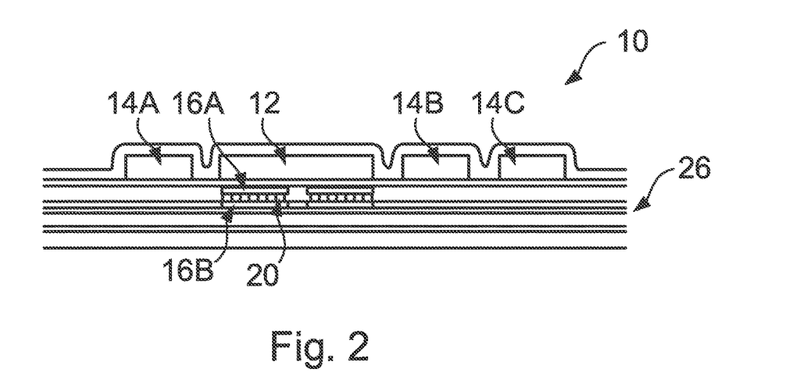
FIG. 2 shows a cross-section of part of the transformer of FIG. 1.

FIGS. 1A, 1B and 1C show the primary and secondary windings of a transformer 10 in accordance with an embodiment of the present disclosure. FIG. 2 shows a cross-section of part of the transformer 10 of FIG. 1.

The transformer 10 may include in an integrated transceiver, provided on or in a semiconductor substrate. Further example features of such a transceiver will be discussed in more detail below. The windings of the transformer 10 may be formed on or above a major surface of the semiconductor substrate in which the transceiver is integrated. For instance, the windings of the transformer 10 may be formed from the patterned metal layers (e.g. metal tracks) of a metallisation stack 20. Accordingly, the transformer may be manufactured using standard Back End of Line (BEOL) processing techniques. The laminated configuration of the windings in this embodiment can be most clearly appreciated from FIG. 2. As is known in the art, the conductive features in the stack 26 may be separated by intervening dielectric layers. One or more capping layers (scratch protection layers) may be located at or near the top of the stack 26.

The transformer includes one or more primary windings 12. The transformer also includes a first set of one or more secondary windings 14. The transformer further includes a second set of one or more secondary windings 16. The primary and secondary windings of the transformer 10 in the present example are substantially hexagonal, although other shapes are envisaged. The primary 12 and secondary winding(s) 14, 16 of the transformer 10 may be substantially concentric.

In the present example, the windings of the transformer 10 are laminated (e.g. provided in the various layers of a metallisation stack. A first layer (e.g. uppermost layer) may include the features shown in FIG. 1A. A second layer (e.g. intermediate layer) may include the features shown in FIG. 1B. A third layer (e.g. lowermost layer) may include the features shown in FIG. 1C.

In the present example, the one or more primary windings 12 of the transformer 10 are located in the first layer (FIG. 1A). The first layer also includes a first set of one or more secondary windings 14 of the transformer. The secondary windings 14 in this example include an outermost secondary winding 14A and one or more inner secondary windings 14B, 14C. The primary winding(s) 12 may be located in-between the secondary windings 14. For example, as shown in FIG. 1A, the primary winding(s) 12 may be located in-between the outermost secondary winding 14A and the one or more inner secondary windings 14B, 14C.

In the present example, the second set of one or more secondary windings 16 is located in the second layer (see the secondary windings labelled 16A) and the third layer (see the secondary windings labelled 16A).

The transformer 10 may also include features for interconnecting the various windings. For instance, metal filled vias 20 may extend between the layers to form interconnections of this kind. In another example, the second layer shown in FIG. 1B includes a bridge portion 22, which is used to cross the winding 14 over the one or more primary windings 12 in the first layer. Similarly, the bridge portion 24 located in the second layer (FIG. 1B) is used to cross the winding 14 over itself in the first layer. As can be seen in FIG. 2, metal filled vias 20 may also interconnect the features of the second set of one or more secondary windings 16 located in the second and third layers.

The transformer also includes an input 2 and two outputs 4, 6. The outputs 4, 6 are both differential outputs. In this example, input 2 is a differential input.

The input 2 is coupled to the one or more primary windings 12 of the transformer 10. The input 2 in this example includes a first terminal 2A located in the first layer (FIG. 1A) and a second terminal 2B located in the second layer (FIG. 1B). Note that the second terminal 2B is coupled to one end of the one or more primary windings 12 in the first layer by metal filled vias 20.

The output 4 is coupled to the ends of the first set of one or more secondary windings 14 of the transformer 10. The output 6 is coupled to the ends of the second set of one or more secondary windings 16 of the transformer 10.

The first set of secondary winding(s) 14 may have a different number of windings to the second set of secondary winding(s) 16. In this way, the first set of secondary winding(s) 14 may have a different winding ratio with respect to the primary winding(s) 12 than the second set of secondary winding(s) 16. This can allow the transformer 10 to be tuned/optimised for particular applications (e.g. the specific configuration of the receive path and/or the transmit path to be described in more detail below).

Figure 3:
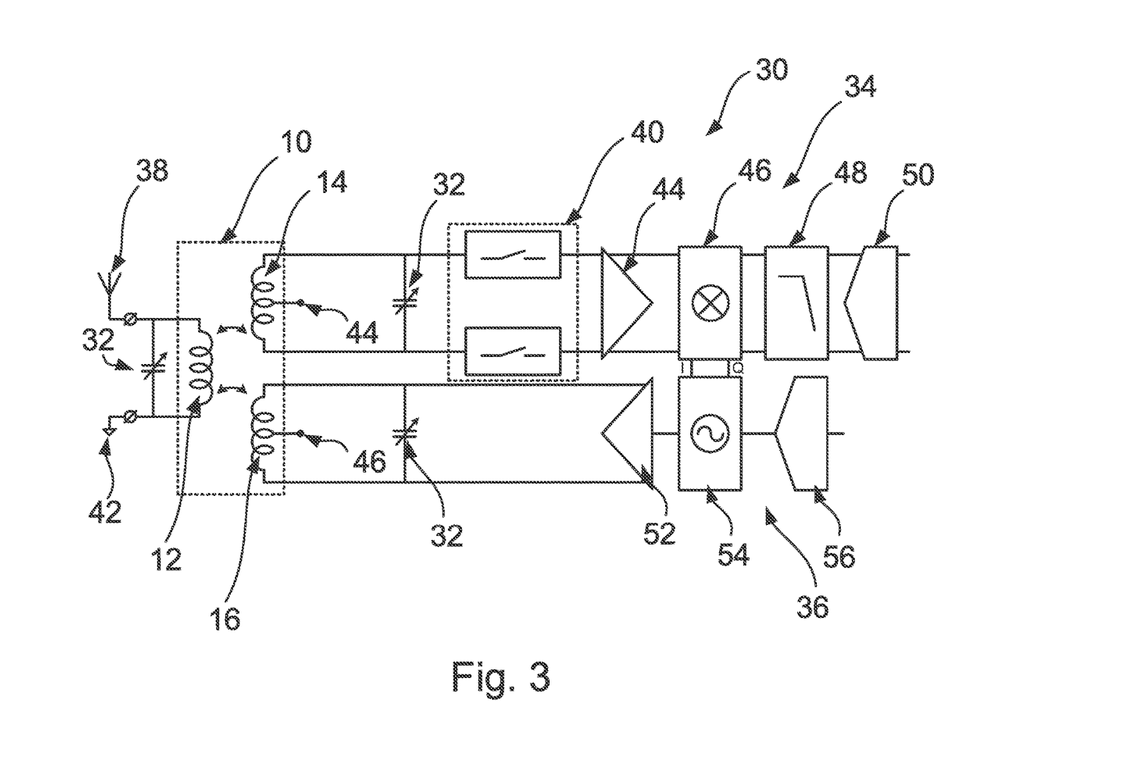
FIG. 3 shows a transceiver in accordance with an embodiment of the present disclosure.

FIG. 3 shows a transceiver 30 in accordance with an embodiment of the present disclosure. As noted previously, the components of the transceiver 30 may be integrated in a semiconductor substrate. The transceiver 30 includes a transformer 10 of the kind described above. FIG. 3 schematically shows the primary 12 and first and second sets 14, 16 of secondary windings of the transformer 10.

The transceiver 30 in this example includes a receive path 34 and a transmit path 36. The first differential output 4 of the transformer 10 is coupled to the receive path 34. The second differential output 6 of the transformer 10 is coupled to the transmit path 36. The input 2 may be coupled to an antenna 38. In the present example, a first terminal 2A/2B of the input 2 is coupled to an antenna, while the other terminal 2B/2A is coupled to ground 42.

Figure 4:
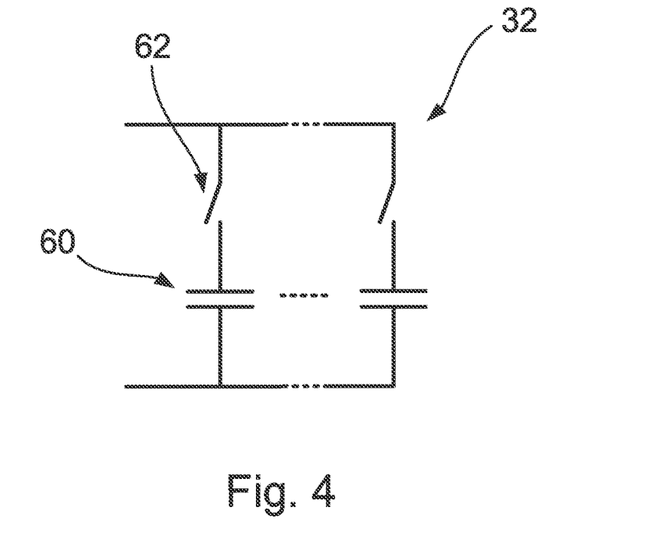
FIG. 4 shows a capacitor bank in accordance with an embodiment of the present disclosure.

The transceiver 30 in this example includes a number of capacitor banks 32. These capacitor banks 32 may be coupled to the windings 12, 14, 16 of the transformer 10 for tuning an operating frequency of the transformer. FIG. 4 shows an example of such a capacitor bank 32. The capacitor bank 32 includes a plurality of capacitors 60 arranged in parallel. Each capacitor 60 may be connected in series with a respective switch 62. By selectively opening and closing one or more of the switches 62, the capacitance added to the circuit by the capacitor back 32 may be varied. The switches 62 may be programmable. In some examples, the switches may be operable to open/close to compensate for manufacturing variations and/or environmental factors (e.g. temperature).

In some embodiments, the receive path 34 may include a switch 40. The switch may be switchable between an ON state and an OFF state. The switch 40 may be implemented using one or more MOS transistors (e.g. NMOS).

In the ON state, the switch 40 couples the receive path 34 to the first differential output 4 of the transformer 10. In the OFF state, the switch 40 decouples the receive path 34 from the first differential output 4. The switch 40 may be operable switch to the OFF state to decouple the receive path 34 from the first differential output 4 when the transmit path 36 is active. This may avoid high voltage swings coming into the receive path 34 from the transmit path 36, which may prevent damage of potentially sensitive components of the receive path 34.

In some embodiments, the transformer 10 may include a number of centre taps. In the example shown in FIG. 3, the transformer 10 is provided with a first centre tap 44 and a second centre tap 46. The first centre tap 44 is coupled to the first set of secondary winding(s) 14. The second centre tap 46 is coupled to the second set of secondary winding(s) 16. The centre taps may allow the common mode voltage of the receive path 34 and the transmit path 36 to be fixed.

Voltages may be applied (e.g. programmably) to the centre tap 44 for optimising the performance of the switch 40. For instance, the center tap 44 may be operable to couple to ground when the switch is in the ON state. This may reduce the ON state resistance of a MOS transistor forming the switch 40. Also, when the input level is high (e.g. (10 dBm)) this may reduce or prevent clipping of the signal by a parasitic diode formed by the drain-bulk junction of the switch. The center tap 44 may also be operable to couple to a supply voltage of the integrated circuit or to a voltage intermediate the supply voltage and ground when the switch is in the OFF state. This may reduce to OFF state capacitance of a MOS transistor forming the switch. Also, when the output level is high (e.g. (10 dBm)) this may similarly reduce or prevent clipping of the signal.

The receive path 34 and transmit path 36 of the transceiver 30 may include a number components for processing a signal to be sent/received by the antenna 38 via the transformer 10. For instance, the receive path 34 may include one or more of: an amplifier (e.g. a low noise amplifier (LNA) 44), a mixer 46, an intermediate frequency (IF) filter and an analogue to digital converter 50. The transmit path 36 may include one or more of: a power amplifier 52, a phase locked loop (PLL) 54 and a digital to analogue converter 56.

The receive path 34 may also include an attenuator (not shown in FIG. 3). The attenuator may, for instance, be located between the switch 40 and the low noise amplifier 44.

Figure 5A:
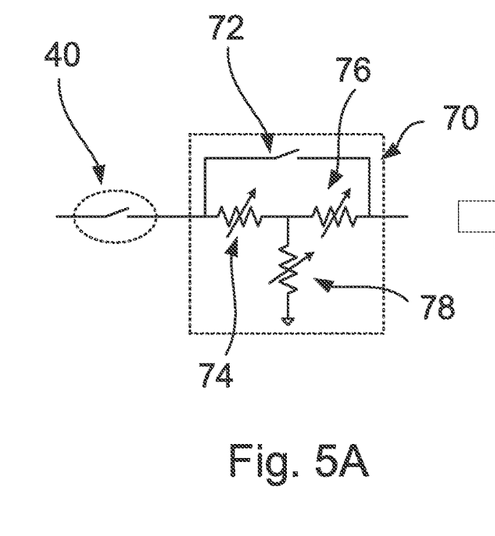
FIG. 5A shows a switch in series with an attenuator in accordance with an embodiment of the present disclosure.

FIG. 5A shows a part of the receive path 34 including the switch 40 and an attenuator 70. The attenuator 70 includes resistors 74, 76, 78. The resistors 74, 76 are arranged in series in the receive path 34. The resistor 78 is connected between ground and a node located in-between the two series connected resistors 74, 76. The attenuator 70 includes a switch 72 arranged in parallel with the series connected pair of resistors 74, 76. The switch 72 may be closed so as to bypass the resistors of the attenuator 70, or opened so that the attenuator 70 attenuates the signal in the receive path 34. During operation, the attenuation provided by the attenuator 70 may be varied by varying the resistors 74, 76, 78 and/or by opening/closing the switch 72.

It is envisaged that the function of the switch 40 may incorporated into the attenuator 70. This may allow the switch 40 to be omitted. An example of this is shown in FIG. 5B.

Figure 5B:
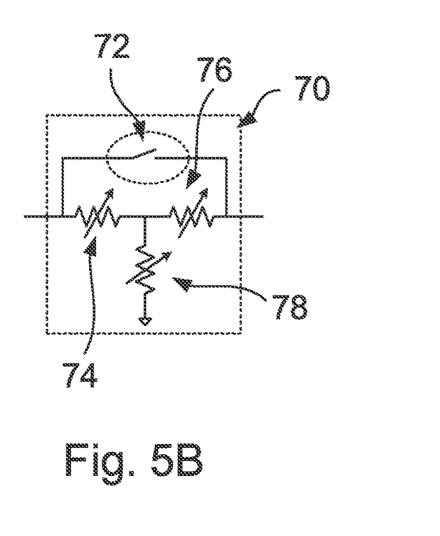
FIG. 5B shows an attenuator in accordance with an embodiment of the present disclosure.

The attenuator 70 shown in FIG. 5B has a similar construction to that of the attenuator 70 in FIG. 5A. However, the switch 72 in the attenuator 70 in FIG. 5B is operable to function in a manner similar to that described above in respect of the switch 40. E.g. the switch 72 may be operable switch to an OFF state to decouple the receive path 34 from the first differential output 4 when the transmit path 36 is active. As described previously, this may avoid high voltage swings coming into the receive path 34 from the transmit path 36. In this embodiment, at least some of the resistors 74, 76, 78 (and typically at least the resistor 74) may comprise resistor banks as described below in relation to FIG. 6, in which the switches 82 of the resistor bank(s) may also operate (i.e. be opened) to decouple the receive path 34 from the first differential output 4 when the transmit path 36 is active. In this way, high voltage swings through the resistors 74, 76, 78 along the receive path 34 from the transmit path 36 may be avoid when the switch 72 is in the OFF state.

Figure 6:
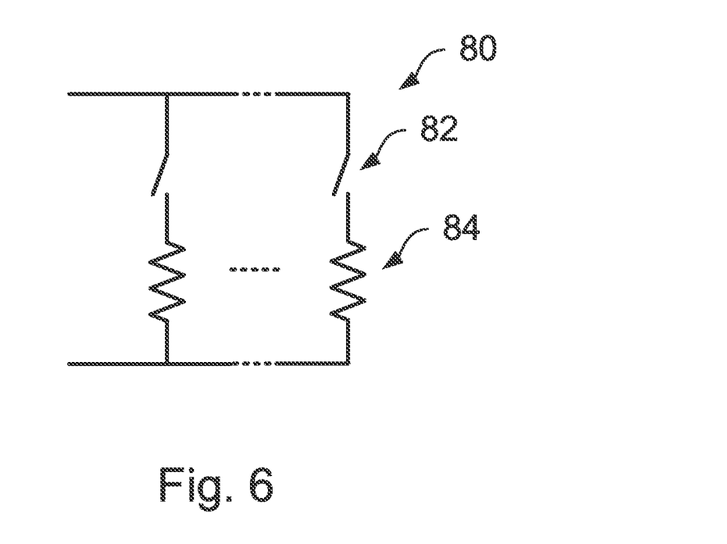
FIG. 6 shows a resistor bank in accordance with an embodiment of the present disclosure.
Figure 7:
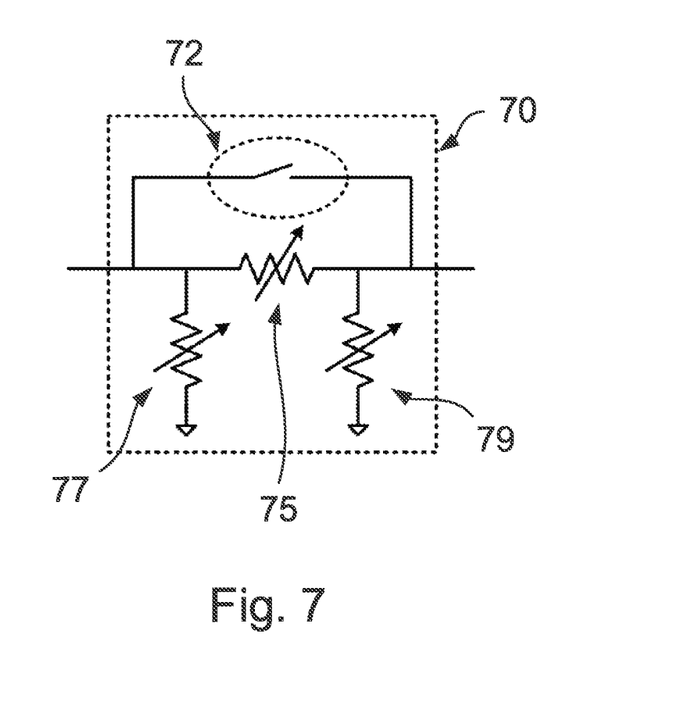
FIG. 7 shows an attenuator in accordance with an embodiment of the present disclosure.

FIG. 7 shows another example of an attenuator 70, which may be included in the receive path 34. In this example, the attenuator 70 includes a switch 72, which operates in a manner similar to that described above in respect of FIG. 5B. In FIG. 7, the attenuator 70 includes resistors 75, 77, 79. The resistor 75 is arranged in series in the receive path 34. The resistor 77 is connected between ground and an end of the resistor 75 closest the transformer 10. The resistor 79 is connected between ground and an end of the resistor 75 furthest from the transformer 10. During operation, the attenuation provided by the attenuator 70 may be varied by varying the resistors 75, 77, 79 and/or by opening/closing the switch 72. As with the example of FIG. 5B, at least some of the resistors 75, 77, 79 (and typically at least the resistor 75) may comprise resistor banks as described below in relation to FIG. 6, in which the switches 82 of the resistor bank(s) may also operate (i.e. be opened) to decouple the receive path 34 from the first differential output 4 when the transmit path 36 is active. In this way, high voltage swings through the resistors 75, 77, 79 along the receive path 34 from the transmit path 36 may be avoided when the switch 72 is in the OFF state.

Figure 8:
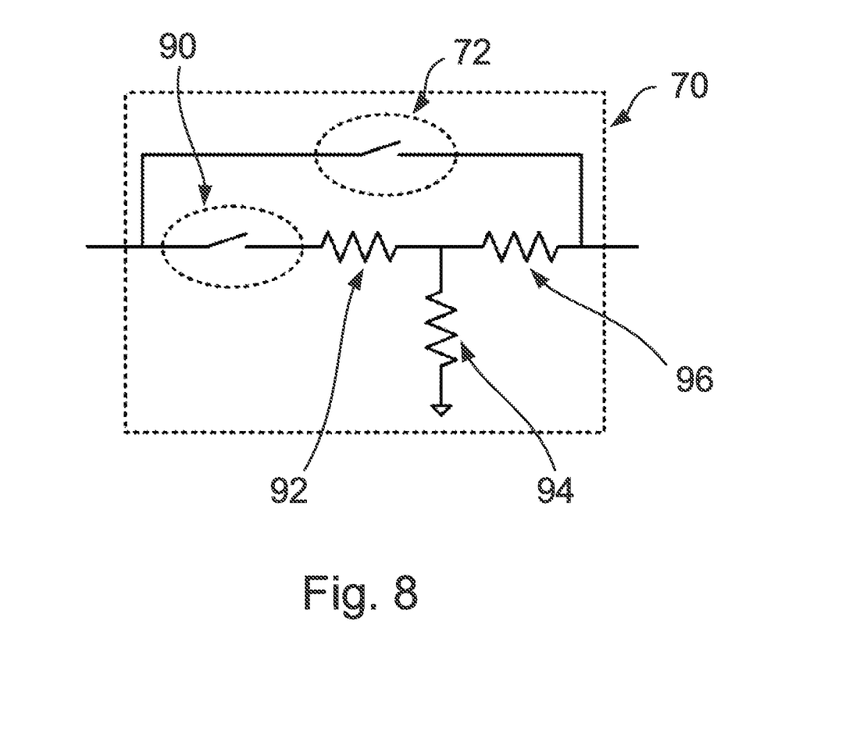
FIG. 8 shows an attenuator in accordance with an embodiment of the present disclosure.

FIG. 8 shows a further example of an attenuator 70, which may be included in the receive path 34. In this example, the attenuator 70 includes a switch 72, which operates in a manner similar to that described above in respect of FIG. 5B. In FIG. 8, the attenuator 70 includes resistors 92, 94, 96. In this example, the resistors 92, 96 are fixed (non-variable) resistors. The resistors 92, 96 are arranged in series in the receive path 34. The resistor 94 is connected between ground and a node located in-between the two series connected resistors 92, 96. A further switch 90 is provided in series with the two series connected resistors 92, 96. This switch 90 may operate similarly to the switch 72, as described above. In particular, in this embodiment, it is envisaged that the switches 72, 90 may operate together for decoupling the receive path 34 from the first differential output 4 when the transmit path 36 is active. During operation, the attenuation provided by the attenuator 70 may be varied by opening/closing the switches 72, 90.

In each example attenuator in which variable resistors are used, it is envisaged that the resistors 74, 76, 78, 75, 77, 79 may be variable resistors. Similarly, as noted previously, it is also envisaged that each resistor 74, 76, 78, 75, 77, 79 may comprise a programmable bank of resistors. An example of such a resistor bank 80 is shown in FIG. 6. The resistor bank 80 in FIG. 6 includes a plurality of resistors 84 arranged in parallel. Each resistor 84 may be connected in series with a respective switch 82. By selectively opening and closing one or more of the switches 82, the resistor provided by the resistor bank 80 may be varied. The switches 82 may be programmable. As noted previously, it is further envisaged that the switches 82 may themselves also operate to may operate as described above for decoupling the receive path 34 from the first differential output 4 when the transmit path 36 is active.

It is envisaged that the resistors of the example attenuators 70 described herein may be replaced with capacitors. As with the resistors described above, it is envisaged that the capacitors may be variable capacitors and/or may be implemented using a capacitor bank. The capacitor bank(s) may be similar to the resistor bank 80 shown in FIG. 6, in which the resistors 84 are replaced with capacitors.

The attenuators described herein may be fixed or may programmable by software or by an Automatic Gain Control (AGC) algorithm.

Accordingly, there has been described an integrated circuit comprising a transceiver including a transformer. The transformer includes an input coupled to one or more primary windings. The transformer also includes a first differential output coupled to a first set of one or more secondary windings. The transformer further includes a second differential output coupled to a second, different set of one or more secondary windings. A method of making an integrated circuit comprising a transceiver. The method includes forming a plurality of components on and/or in a semiconductor substrate. At least one of the components comprises a transformer. The method includes forming the transformer by forming one or more primary windings coupled to an input, forming a first set of one or more secondary windings coupled to a first differential output, and forming a second, different set of one or more secondary windings coupled to a second differential output.

Although particular embodiments of this disclosure have been described, it will be appreciated that many modifications/additions and/or substitutions may be made within the scope of the claims.

The invention claimed is:

1. An integrated circuit comprising a transceiver, the transceiver including a transformer, the transformer comprising:
   an input coupled to one or more primary windings of the transformer;
   a first differential output coupled to a first set of one or more secondary windings of the transformer;
   a second differential output coupled to a second, different set of one or more secondary windings of the transformer, wherein:
      the first differential output is coupled to a receive path of the transceiver,
      the second differential output is coupled to a transmit path of the transceiver,
      the receive path includes a switch that is switchable between an ON state for coupling the receive path to the first differential output and an OFF state for decoupling the receive path from the first differential output, and wherein the switch is operable switch to said OFF state to decouple the receive path from the first differential output when the transmit path is active; and
   a center tap coupled to the first set of secondary winding(s), wherein the center tap is operable to:
   connect to ground when the switch is in the ON state; and
   connect to a supply voltage of the integrated circuit or to a voltage intermediate the supply voltage and ground when the switch is in the OFF state.

2. The integrated circuit of claim 1, wherein the switch is included in an attenuator of the receive path.

3. The integrated circuit of claim 1, wherein the input is coupled to an antenna.

4. The integrated circuit of claim 1, wherein the first set of secondary winding(s) has a different number of windings to the second set of secondary winding(s), whereby the first set of secondary winding(s) has a different winding ratio with respect to the primary winding(s) than the second set of secondary winding(s).

5. The integrated circuit of claim 1, further comprising a capacitor bank coupled to at least some of the windings of the transformer for tuning an operating frequency of the transformer.

6. The integrated circuit claim 1, wherein the primary and secondary winding(s) of the transformer are substantially concentric.

7. The integrated circuit of claim 1, wherein the primary and secondary winding(s) of the transformer comprise electrically conductive tracks arranged on a surface of a semiconductor substrate of the integrated circuit.

8. The integrated circuit of claim 7, wherein the primary winding(s) and at least one of said sets of secondary winding(s) are arranged in a common plane.

9. The integrated circuit of claim 8, wherein the primary winding(s) are arranged in-between some of the secondary winding(s) in said common plane, when viewed from above the surface of the semiconductor substrate.

10. The integrated circuit of claim 1, wherein the windings of at least one of said sets of secondary winding(s) are arranged in more than one plane.

11. The integrated circuit of claim 1, wherein the input is a differential input.

12. A method of making an integrated circuit comprising a transceiver, the method comprising:
   providing a semiconductor substrate; and
   forming a plurality of components on and/or in the semiconductor substrate, wherein at least one of said components comprises a transformer, and wherein the method includes forming the transformer by:
      forming one or more primary windings coupled to an input of the transformer;
      forming a first set of one or more secondary windings coupled to a first differential output of the transformer;
      forming a center tap coupled to the first set of secondary winding(s), wherein the center tap is operable to:
      connect to ground when the switch is in the ON state, and
      connect to a supply voltage of the integrated circuit or to a voltage intermediate the supply voltage and ground when the switch is in the OFF state;

forming a receive path of the transceiver, wherein the first differential output is coupled to the receive path, and wherein the receive path includes a switch that is switchable between an ON state for coupling the receive path to the first differential output and an OFF state for decoupling the receive path from the first differential output, and wherein the switch is operable switch to said OFF state to decouple the receive path from the first differential output when the transmit path is active;

forming a second, different set of one or more secondary windings coupled to a second differential output of the transformer; and forming a transmit path of the transceiver, wherein the second differential output is coupled to the transmit path.

* * * * *